(12) United States Patent
Mangtani

(10) Patent No.: US 6,249,024 B1
(45) Date of Patent: Jun. 19, 2001

(54) POWER MODULE WITH REPOSITIONED POSITIVE AND REDUCED INDUCTANCE AND CAPACITANCE

(75) Inventor: Vijay Mangtani, Playa del Rey, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/456,648

(22) Filed: Dec. 8, 1999

Related U.S. Application Data

(60) Provisional application No. 60/111,530, filed on Dec. 9, 1998.

(51) Int. Cl.[7] .......... H01L 31/119; H01L 23/52; H01L 23/04; H01L 23/34
(52) U.S. Cl. .......... 257/341; 257/343; 257/401; 257/691; 257/698; 257/724
(58) Field of Search .................. 257/341, 343, 257/365, 401, 691, 698, 724

(56) References Cited

U.S. PATENT DOCUMENTS

| | | | |
|---|---|---|---|
| 5,471,089 | * 11/1995 | Nagatomo et al. | 257/691 |
| 5,563,447 | * 10/1996 | Lake et al. | 257/724 |
| 5,736,786 | * 4/1998 | Sankaran et al. | 257/717 |
| 5,767,567 | * 6/1998 | Hu et al. | 257/666 |
| 5,895,974 | * 4/1999 | Eytcheson et al. | 257/723 |
| 6,069,403 | * 5/2000 | Shekhawat et al. | 257/724 |

* cited by examiner

Primary Examiner—Ngân V. Ngô
(74) Attorney, Agent, or Firm—Ostrolenk, Faber, Gerb & Soffen, LLP

(57) ABSTRACT

A power module includes a three-phase inverter circuit. The positive and negative terminals of the module are centrally located on opposing sides of the module to reduce the length of the current path between the terminals. The reduced current path length significantly reduces the inductance and capacitance of the module.

7 Claims, 2 Drawing Sheets

POWER MODULE WITH REPOSITIONED POSITIVE AND REDUCED INDUCTANCE AND CAPACITANCE

CROSS REFERENCE TO RELATED APPLICATION

This application is based on and claims priority to U.S. Provisional Patent Application No. 60/111,530, filed Dec. 9, 1998, the entire disclosure of which is hereby incorporated by reference.

BACKGROUND OF THE INVENTION

1. Field of the Invention

The present invention is directed to power modules and, more particularly, to an arrangement of the terminals of a power module which reduces the inductance and capacitance of the module.

2. Related Art

In known power modules, the inductance is proportional to the length of the conductor. Further, mounting the power module on a heatsink (normally connected to Earth) creates a capacitance between the power devices and Earth. This capacitance is proportional to the area of the conductor, and is proportional to the conductor length for the same width.

Typically, in a three-phase inverter layout in a power module, the critical inductance is in the leads connecting from the positive bus through the devices of the individual arms of the inverter and is in the leads connecting the devices back to the negative bus. The presence of a high stray inductance increases the switching stress on the semiconductor.

Furthermore, when IGBTs are included in the inverter circuit, high frequency switching currents are induced by the turn-on and turn-off of the IGBT as well as during the antiparallel diode recovery time. The leads that carry these high frequency currents thus act as an antenna and produce electromagnetic emissions. When the conductors are sufficiently long, the electromagnetic emissions will reach an unacceptable level.

FIG. 1 shows a known arrangement for a three-phase inverter circuit. Here, a first arm of the inverter includes series-connected MOS-gated devices Q1 and Q2 with their respective anti-parallel connected diodes D1 and D2 as well as an output terminal U connected to the node between the two MOS-gated devices. A second arm similarly includes series-connected devices Q3 and Q4 with their respective anti-parallel connected diodes D3 and D4 with output terminal V arranged between the two devices. Further, a third arm includes devices Q5 and Q6 with their respective anti-parallel connected diodes D5 and D6 with output terminal W connected to the node situated between the two devices. Each arm is supplied by a positive terminal P and returns to a negative terminal N.

The inductance of the third arm, for example, is proportional to the length of the current path that extends from positive terminal P to node A, node B, devices Q5 and Q6 with diodes D5 and D6, node C, node D and finally negative terminal N. Additionally, body diodes D5 and D6 recover through the same path that forms the inductance so that the recovery current for the diodes is supplied through an external capacitor which is connected across terminals P and N. Capacitive coupling between conductors experiencing high dv/dt to Earth causes undesirable ground leakage current, deteriorating EMI performance.

It is therefore desirable to reduce the inductance and capacitance of the module for better electromagnetic interference (EMI) performance and for reduced voltage overshoot.

SUMMARY OF THE INVENTION

The present invention addresses these problems by providing a power module in which the positive and negative terminals are situated closer to the arms of the three-phase inverter circuit. The close proximity of the terminals to the arms of the inverter advantageously reduces the inductance and capacitance of the circuit and thereby reduces electromagnetic emissions from the circuit.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which.

DETAILED DESCRIPTION OF THE INVENTION

Figure 1:
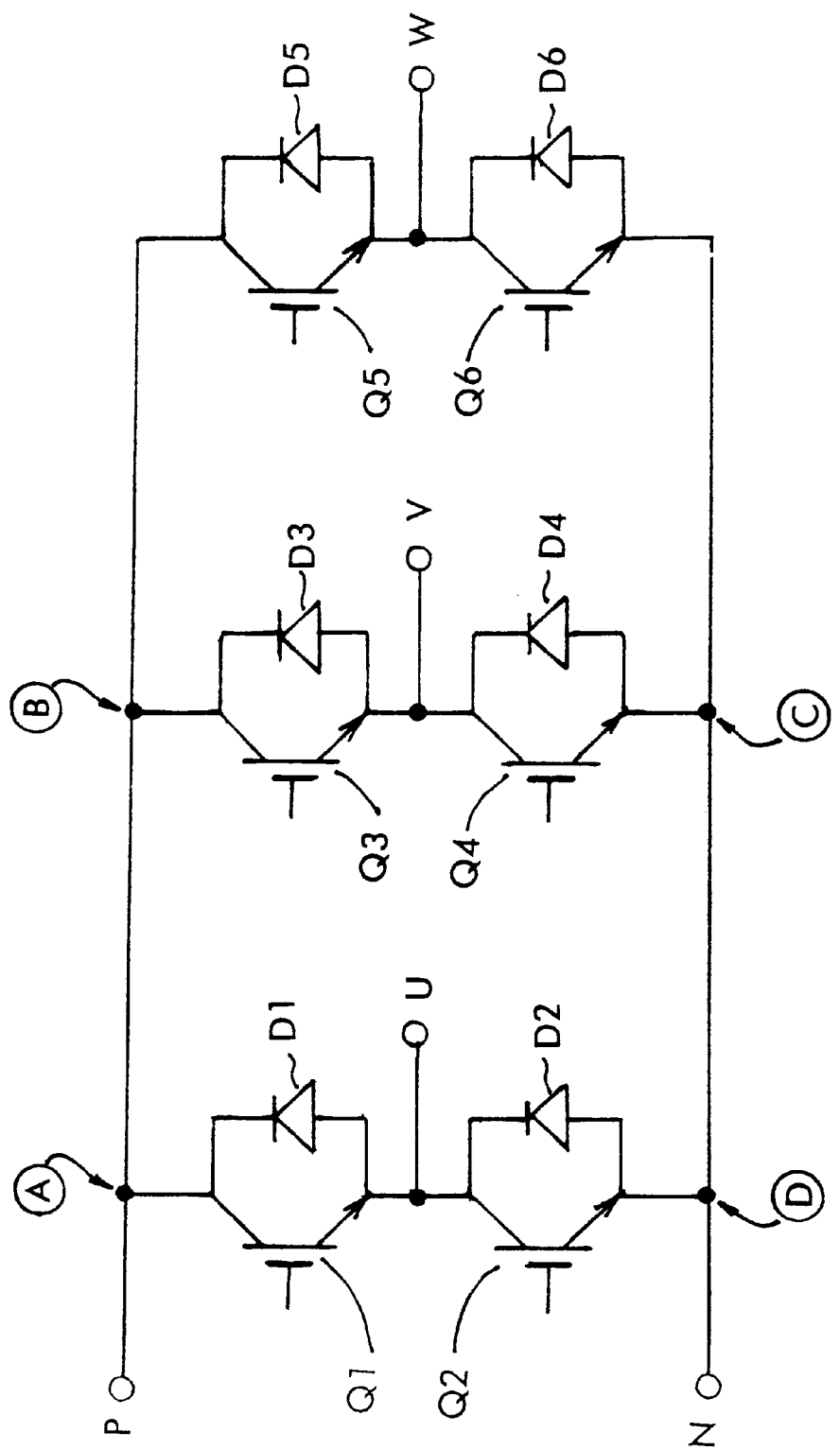
FIG. 1 is a circuit diagram showing a known arrangement for a three-phase inverter circuit.
Figure 2:
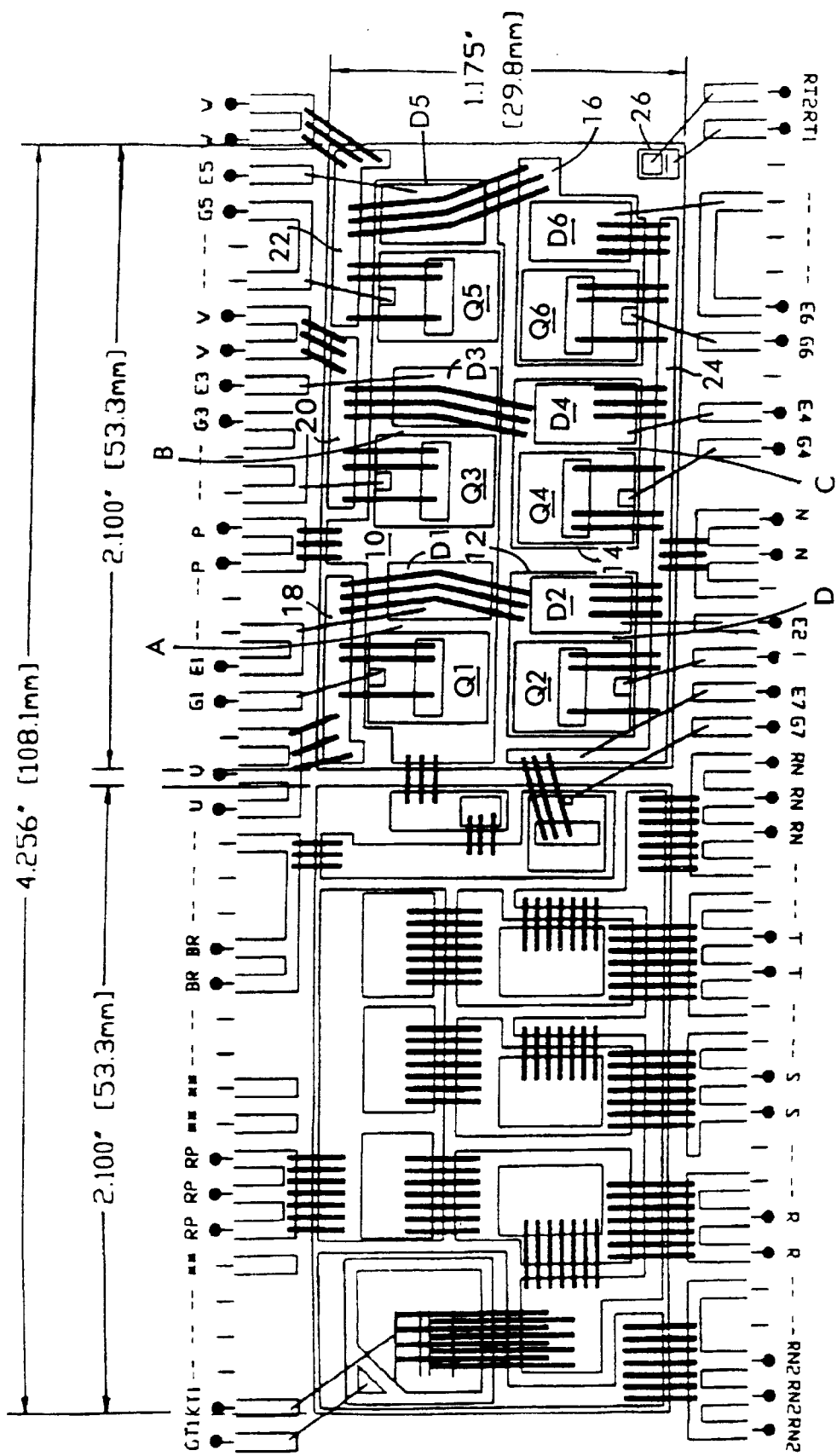
FIG. 2 shows an arrangement of a three-phase inverter circuit in accordance with an embodiment of the invention.

Referring to FIG. 2, there is shown a module which includes a three-phase inverter circuit according to an embodiment of the invention.

Here, a first leg of the inverter circuit includes series-connected MOS-gated devices Q1 and Q2 each having a bottom surface having a terminal connected to main pad areas 10 and 12, respectively, and having a top surface having a gate bonding pad that is wire bonded to external pins G1 and G2, respectively, as well as another bonding pad that is wire-bonded to pad areas 18 and 24, respectively, of the lead frame. Also provided are diodes D1 and D2 which are connected in anti-parallel with MOS-gated devices Q1 and Q2, respectively. The bottom surface of devices D1 and D2 are electrically connected to respective pad areas 10 and 12 and the top surfaces are connected by wire bonds to pad areas 18 and 24, respectively. The second leg, which includes series-connected MOS-gated devices Q3 and Q4 as well as their respective anti-parallel connected diodes D3 and D4, and the third leg which includes series-connected MOS-gated devices Q5 and Q6 as well as their respective anti-parallel connected diodes D5 and D6, are each mounted in a similar manner.

Advantageously, and in accordance with the invention, the positive terminal P' and the negative N' are centrally located on opposing sides of the module between nodes A and B and between nodes C and D, respectively, and are connected to pad areas 10 and 24, respectively, to reduce the length of the current path between the two terminals and thereby reduce the inductance and capacitance of the module.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module, comprising:
   first through sixth MOS-gated switching transistor dice each having a pair of power terminals and a control terminal;

a substrate;

a first die pad disposed on the substrate and including longitudinally spaced apart opposing ends, one of the power terminals of the first, third and fifth MOS-gated switching transistor dice being coupled to the first die pad;

second, third and fourth die pads disposed on the substrate and longitudinally adjacent the first die pad, one of the power terminals of the second, fourth and sixth MOS-gated transistor dice being coupled to respective ones of the second, fourth and sixth die pads such that they are substantially oppositely disposed from the first, third, and fifth MOS-gated transistor dice, respectively;

a first bonding pad disposed on the substrate and including longitudinally spaced apart opposing ends, the first bonding pad extending substantially adjacent the second, third and fourth die pads, the other of the power terminals of the second, fourth and sixth MOS-gated switching transistor dice being coupled to the first bonding pad;

a positive bus terminal being coupled to the first die pad at a position between the longitudinal ends thereof; and a negative bus terminal being coupled to the first bonding pad at a position between the longitudinal ends thereof.

2. The power module of claim 1, wherein the MOS-gated switching transistor dice are taken from the group consisting of MOSFET dice and IGBT dice.

3. The power module of claim 1, further comprising:

second, third and fourth bonding pads disposed adjacent the first die pad, the other of the power terminals of the first, third, and fifth MOS-gated switching transistor dice being coupled to the second, third and fourth bonding pads, respectively; and first, second and third output terminals being coupled to the second, third and fourth bonding pads, respectively.

4. The power module of claim 1, further comprising first through sixth diode dice each including an anode and a cathode and being disposed adjacent to and connected in an anti-parallel configuration with the first through sixth MOS-gated switching transistor dice, respectively.

5. The power module of claim 4, wherein the cathodes of the first, third and fifth diode dice are disposed on the first die pad and the cathodes of the second, fourth and sixth diode dice are disposed on the second, third and fourth die pads, respectively.

6. The power module of claim 5, wherein the second die pad is coupled to the anode of the first diode die and the second bonding pad, the third die pad is coupled to the anode of the third diode die and the third bonding pad, and the fourth die pad is coupled to the anode of the fifth diode die and the fourth bonding pad.

7. The power module of claim 6, wherein the anodes of the second, fourth and sixth diode dice are coupled to the first bonding pad, each having a pair of power terminals and a control terminal;

a substrate;

a first die pad disposed on the substrate and including longitudinally spaced apart opposing ends, one of the power terminals of the first, third and fifth MOS-gated switching transistor dice being coupled to the first die pad;

second, third and fourth die pads disposed on the substrate and longitudinally adjacent the first die pad, one of the power terminals of the second, fourth and sixth MOS-gated transistor dice being coupled to respective ones of the second, fourth and sixth die pads such that they are substantially oppositely disposed from the first, third, and fifth MOS-gated transistor dice, respectively;

a bonding pad disposed on the substrate and including longitudinally spaced apart opposing ends, the bonding pad extending substantially adjacent the second, third and fourth die pads, the other of the power terminals of the second, fourth and sixth MOS-gated switching transistor dice being coupled to the bonding pad;

a positive bus terminal being coupled to the first die pad at a position between the longitudinal ends thereof; and a negative bus terminal being coupled to the bonding pad at a position between the longitudinal ends thereof.

* * * * *